(12) United States Patent
Chen et al.

(10) Patent No.: US 11,398,810 B2
(45) Date of Patent: Jul. 26, 2022

(54) DEVICE FOR SIGNAL PROCESSING

(71) Applicant: Robert Bosch GmbH, Stuttgart (DE)

(72) Inventors: Lizhuo Chen, Stuttgart (DE);
Bernhard Opitz, Reutlingen-Betzingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 358 days.

(21) Appl. No.: 16/633,085

(22) PCT Filed: Jun. 11, 2018

(86) PCT No.: PCT/EP2018/065319
§ 371 (c)(1),
(2) Date: Jan. 22, 2020

(87) PCT Pub. No.: WO2019/020258
PCT Pub. Date: Jan. 31, 2019

(65) Prior Publication Data
US 2021/0159888 A1    May 27, 2021

(30) Foreign Application Priority Data
Jul. 27, 2017  (DE) .......................... 10 2017 212 916.6

(51) Int. Cl.
*H03H 17/06*   (2006.01)
(52) U.S. Cl.
CPC .............................. *H03H 17/0671* (2013.01)
(58) Field of Classification Search
CPC .............................................. H03H 17/0671
See application file for complete search history.

(56) References Cited

U.S. PATENT DOCUMENTS 6,163,787 A * 12/2000 Menkhoff .......... H03H 17/0279
708/316
7,196,648 B1    3/2007 Ding et al.
(Continued)

FOREIGN PATENT DOCUMENTS

EP          0889586 A1    1/1999
JP       2005124155 A    5/2005
(Continued)

OTHER PUBLICATIONS

International Search Report for PCT/EP2018/065319, dated Sep. 3, 2018.
(Continued)

*Primary Examiner* — Chuong D Ngo
(74) *Attorney, Agent, or Firm* — Norton Rose Fulbright US LLP; Gerard Messina

(57) ABSTRACT

A device for signal processing includes a signal input, a control input, and a CIC filter of an nth order for filtering the input signal. The CIC filter includes n integrators, which are disposed one behind the other and include a memory in each case, and n is greater than one. For each of n−1 first integrators, the device includes an associated correction calculator for correcting an integration error using at least one signal value stored in the memory of the respective first integrator. The device transmits these stored signal values in response to the control signal to the associated correction calculators and to delete the memory of the remaining last integrator. Either the memories of the n−1 first integrators are also deleted, or the device includes a further correction calculator and the signal values are transmitted in response to the control signal also to the further correction calculator.

9 Claims, 1 Drawing Sheet

(56) References Cited

U.S. PATENT DOCUMENTS

| 7,379,002 B1 * | 5/2008 | Zhixu | H03M 3/392 |
| | | | 341/143 |
| 2011/0004647 A1 | 1/2011 | Parida et al. | |

FOREIGN PATENT DOCUMENTS

| JP | 2010130185 A | 6/2010 |
| WO | 9823030 A1 | 5/1998 |
| WO | 2016201216 A1 | 12/2016 |

OTHER PUBLICATIONS

Hogenauer, Eugene, "An Economical Class of Digital Filters for Decimation and Interpolation", IEEE Transactions on Acoustics, Speech and Signal Processing, vol. 29, No. 2, 1981, pp. 155-162.

* cited by examiner

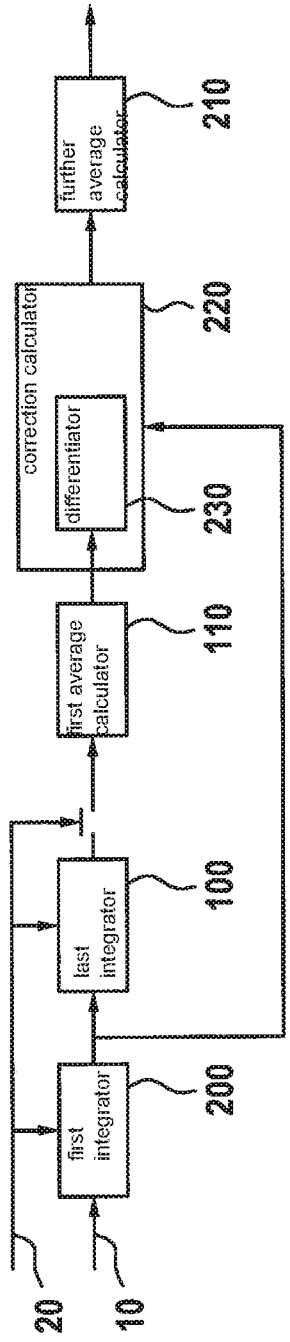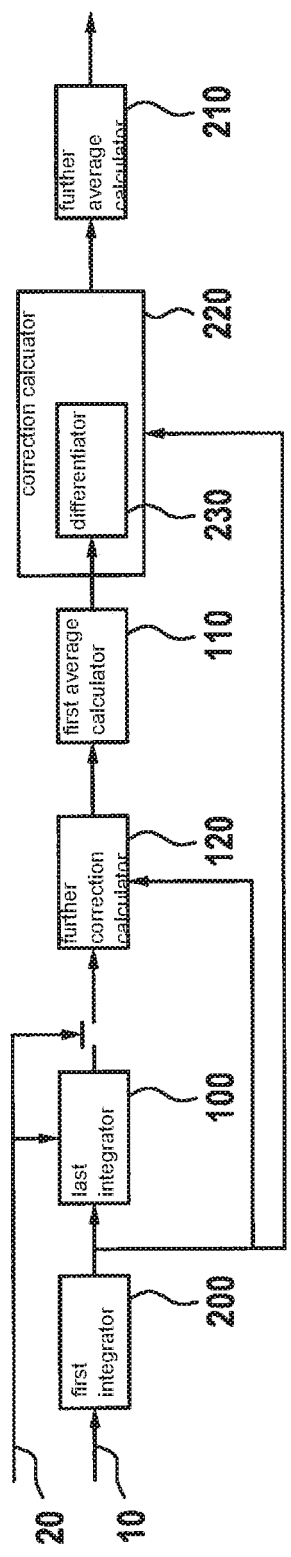

DEVICE FOR SIGNAL PROCESSING

FIELD

The present invention relates to a device for signal processing.

BACKGROUND INFORMATION

Cascading integrator comb filters (CIC filters) are narrow-band digital low-pass filters, which are able to be implemented in an efficient manner and are used for processing signals, but especially not only for processing sensor signals according to a Delta-Sigma modulation, for decimation and interpolation purposes, such as in the communication. A detailed description of CIC filters is in Hogenauer, Eugene B.: "An Economical Class of Digital Filters for Decimation and Interpolation", IEEE Transactions on Acoustics, Speech and Signal Processing, 29(2): 155-162.

CIC filters have at least one recursive moving-average filter featuring a differential delay, the comb section, and an associated integrator or accumulator. The result of the accumulator is then additionally averaged by an average calculator. CIC filters are able to be interleaved with one another so that a number of comb sections is followed by the corresponding number of integrators, and the integrators are followed by the corresponding number of average calculators. The mentioned number defines the order of the CIC filter. CIC filters of a higher order offer a better resolution than CIC filters of the first order.

Variable sampling interval lengths are used in many applications, e.g., in the communication according to the protocol for locally coupled networks (LIN protocol) via a peripheral sensor interface (PS15), a digital interface for the communication of sensors and control units (SENT) or communications protocols in the automotive field.

Generally, CIC filters can be used only for constant sampling interval lengths. Through adaptations, however, it is possible to use CIC filters of the first order also with variable sampling interval lengths.

SUMMARY

According to the present invention, an example device for signal processing is provided as well as an example sensor for a motor vehicle.

The example device includes a signal input for receiving an input signal, a control input for receiving a control signal and a CIC filter of an nth order for filtering the input signal. The CIC filter includes n integrators, which are disposed one behind the other and include a separate memory in each case. N is greater than one in this context. For each n–1 first integrator, the device includes an associated correction calculator for correcting an integration error using at least one signal value stored in the memory of the respective first integrator. The device is developed to transmit these stored signal values in response to the control signal to the associated correction calculators, to delete the memory of the last integrator and/or to supply an input signal of the remaining last integrator at its output ("dump"). The device is furthermore developed either to also delete the memories of the first integrators or it includes a further correction calculator and is developed to transmit these signal values in response to the control signal also to the further correction calculator.

The interruption of the integration by deleting the memory in response to the control signal and the transmission of the stored values makes it possible to use CIC filters of a higher order with variable sampling interval lengths.

In one preferred embodiment, the device includes an average calculator for the last integrator.

This improves the signal characteristic.

The device may additionally or alternatively include an associated average calculator for each integrator, and the average calculators associated with the first integrators are able to be developed to average an output value of the associated correction calculator in each case.

This also improves the signal characteristic.

The correction calculators may include an associated differentiator in each case and be developed to convey an input value at the respective correction calculator to the associated differentiator and to correct an output value of the associated differentiator using the at least one mentioned signal value and to output the corrected output value.

This is a particularly efficient form of correction.

If the device includes the further correction calculator and is developed to transmit the mentioned signal values in response to the control signal to the further correction calculator as well, then the further correction calculator may be developed to correct an output value of the last integrator with the aid of the mentioned signal values, and the average calculator associated with the last integrator may be developed to average an output value of the further correction calculator, and a first one of the correction calculators may be developed to convey the averaged output value of the further correction calculator to the associated differentiator. Then only the memory of the last integrator will still have to be deleted.

If the device is furthermore developed to also delete the memories of the first integrators, then the average calculator associated with the last integrator may be developed to average the output value of the last integrator itself, and a first one of the correction calculators may be developed to convey the averaged output value of the last integrator to the associated differentiator. The correction will then be less complex.

The CIC filter may include n recursive moving-average filters, which are disposed one behind the other and situated upstream from the integrators.

In this way it is easily possible to realize comb sections of the CIC filter.

The first integrators may include a separate counter in each case in order to store information about a memory overflow and be developed to compensate for the influence of the memory overflow on the integration.

In this way, a particularly satisfactory management of the memory overflow is realizable.

Advantageous further developments of the present invention are described herein.

BRIEF DESCRIPTION OF THE DRAWINGS

Exemplary embodiments of the present invention are described in greater detail based on the figures and the description below.

FIG. 1 shows an exemplary embodiment of the present invention.

FIG. 2 shows a second exemplary embodiment of the present invention.

DETAILED DESCRIPTION OF EXAMPLE EMBODIMENTS

FIG. 1 shows a first exemplary embodiment of the present invention, which includes a CIC filter of the second order.

The illustrated device is developed for signal processing of sensor signals, for instance, and includes a signal input 10 and a control input 20. In addition, the device includes a CIC filter of the second order. The CIC filter includes a first recursive moving-average filter, which is developed to determine a first moving average of an input signal applied at signal input 10, and it includes a second recursive moving-average filter, which is developed to determine a second moving average of the first moving average. In addition, the CIC filter includes a first integrator 200, which is developed for the integration of the second moving average, and a memory as well as a last integrator 100, which is developed for the further integration of the integrated second moving average and also includes a memory.

Either the memories of the first integrators (200) are deleted as well or the device includes a further correction calculator (120) and the mentioned signal values are also transmitted to the further correction calculator in response to the control signal.

In addition, the device includes a first average calculator 110 for averaging the second moving average further integrated by last integrator 100. For first integrator 200, the device includes an associated correction calculator 220, which in turn has a differentiator 230 which is developed to determine a change in the averaged, further integrated second moving average. Correction calculator 220 is developed to correct the determined change with the aid of a signal value stored in the memory of first integrator 200.

In the exemplary embodiment, the device is developed to transmit the mentioned stored signal value in response to a control signal at control input 20, e.g., an interrupt request (IRO), to associated correction calculators 220 and to delete the memories of integrators 100, 200 in order to thereby interrupt the integration. The interruption of the integration in first integrator 200 causes an error in the result of the subsequent integration in last integrator 100. According to the present invention, this error is corrected by differentiator 230 and correction calculator 220 before the averaging, e.g. a weighted averaging, is carried out by further average calculator 210. Since no integrator is connected downstream from last integrator 100 and will therefore also not be affected by an interruption of last integrator 100, a correction prior to the averaging, e.g., a weighted averaging, by average calculator 110 will not be necessary.

To enable the correction, the device is developed to transmit a stored output value of the at least one first integrator 200 to associated correction calculator 220. In one exemplary embodiment, the control signal is also used for establishing the connection between last integrator 100 and average calculator 110. This causes down-sampling.

The individual form of the correction is a function of the order of the CIC filter. Using the example of a CIC filter of the second order, the correction simply consists of adding the output value of first integrator 200, stored as the penultimate output value, and the current output value of the differentiator. For CIC filters of a higher order, the correction is able to be determined accordingly so that the effect is compensated for by emptying the memory.

FIG. 2 shows a second exemplary embodiment of the present invention for a CIC filter of the second order. In this instance, the device is developed simply for deleting the memory of last integrator 100 in response to a control signal at control input 20 and to thereby interrupt the integration. The second exemplary embodiment differs from the first exemplary embodiment also by a further correction calculator 120, which is developed to correct the further integrated second moving average before it is averaged by first average calculator 110. Accordingly, in the second exemplary embodiment the connection between first integrator 100 and further correction calculator 120 is interrupted.

In order to avoid overflow errors, the first integrator may include a counter for storing information about memory overflow events and then to compensate for the effect of the memory overflow.

The average calculator, differentiator and correction calculator are able to be programmed into a digital signal processor. In this way the present invention is easily adaptable.

Using general knowledge, the exemplary embodiments described in detail are similarly able to be expanded to CIC filters of the third or a higher order.

The provided invention also allows for the support of protocols that have variable sampling interval lengths. In the process, a high resolution is achievable even with very short sampling interval lengths. As a result, the present invention supports high data rates. Fluctuations in the signal processing time are continuous and deterministic in the present invention. The signal is therefore able to be sampled in an optimal manner without requiring an anti-aliasing filter, which would lead to a restriction of the bandwidth.

What is claimed is:

1. A device for signal processing, comprising:
   a signal input configured to receive an input signal;
   a control input configured to receive a control signal; and
   a CIC filter of an nth order configured to filter the input signal, the CIC filter including n integrators which are disposed one behind the other and include a separate, associated memory for each of the n integrators, n being greater than 1, wherein for each of n–1 first integrators, the device includes an associated correction calculator configured to correct an integration error using at least one signal value stored in the memory of the respective first integrator, and the device is configured to transmit the stored signal values in response to the control signal to the associated correction calculators and to delete the associated memory of a remaining last one of the integrators;
   wherein (a) the device is configured to delete the memories of the first integrators, or (b) the device includes a further correction calculator and is configured to transmit the stored signal values in response to the control signal also to the further correction calculator.

2. The device as recited in claim 1, further comprising:
   an associated first average calculator for the last one of the integrators.

3. The device as recited in claim 1, further comprising:
   a respective, associated average calculator for each of the integrators, and the average calculators associated with the first integrators in each case are configured to average an output value of the associated correction calculator.

4. The device as recited in claim 3, wherein the correction calculators include an associated differentiator and are configured to convey an input value at the respective correction calculator to the associated differentiator and to correct an output value of the associated differentiator using the at least one stored signal value and to output the corrected output value.

5. The device as recited in claim 4, wherein the device is configured according to (b) and the further correction calculator is configured to correct an output value of the last integrator using the stored signal values, and the average calculator associated with the last one of the integrators is configured to average an output value of the further correction calculator, and a first one of the correction calculators is configured to convey the averaged output value of the further correction calculator to the associated differentiator.

6. The device as recited in claim 4, wherein the average calculator associated with the last one of the integrators is configured to average an output value of the last one of the integrators, and a first one of the correction calculators is configured to convey the averaged output value of the last one of the integrators to the associated differentiator.

7. The device as recited in claim 1, wherein the CIC filter has n recursive moving-average filters disposed one behind the other and situated upstream from the integrators.

8. The device as recited in claim 1, wherein each of the first integrators includes a counter configured to store information about a memory overflow and is configured to compensate for an effect of the memory overflow on the integration.

9. A sensor for a motor vehicle, the sensor including a device for signal processing, the device comprising:
    a signal input configured to receive an input signal;
    a control input configured to receive a control signal; and
    a CIC filter of an nth order configured to filter the input signal, the CIC filter including n integrators which are disposed one behind the other and include a separate, associated memory for each of the n integrators, n being greater than 1, wherein for each of n−1 first integrators, the device includes an associated correction calculator configured to correct an integration error using at least one signal value stored in the memory of the respective first integrator, and the device is configured to transmit the stored signal values in response to the control signal to the associated correction calculators and to delete the memory of a remaining last one of the integrators;
    wherein (a) the device is configured to delete the memories of the first integrators, or (b) the device includes a further correction calculator and is configured to transmit the stored signal values in response to the control signal also to the further correction calculator.

* * * * *